US012410521B2

United States Patent
Vintila et al.

(10) Patent No.: US 12,410,521 B2
(45) Date of Patent: Sep. 9, 2025

(54) BIDIRECTIONAL INDEXING APPARATUS

(71) Applicant: Lam Research Corporation, Fremont, CA (US)

(72) Inventors: Adriana Vintila, Wilsonville, OR (US); Matthew Scott Mudrow, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 890 days.

(21) Appl. No.: 17/619,993

(22) PCT Filed: Jun. 17, 2020

(86) PCT No.: PCT/US2020/038179
§ 371 (c)(1),
(2) Date: Dec. 16, 2021

(87) PCT Pub. No.: WO2020/257311
PCT Pub. Date: Dec. 24, 2020

(65) Prior Publication Data
US 2022/0298631 A1    Sep. 22, 2022

Related U.S. Application Data

(60) Provisional application No. 62/864,994, filed on Jun. 21, 2019.

(51) Int. Cl.
*C23C 16/458*   (2006.01)
*B23Q 3/06*   (2006.01)
(Continued)

(52) U.S. Cl.
CPC .......... *C23C 16/4583* (2013.01); *B23Q 3/067* (2013.01); *C23C 16/50* (2013.01); *H01J 37/32733* (2013.01); *H01L 21/68742* (2013.01)

(58) Field of Classification Search
None
See application file for complete search history.

(56) References Cited

U.S. PATENT DOCUMENTS

| 4,311,121 A | 1/1982 | Hartsell |
| 4,346,514 A | 8/1982 | Makizawa et al. |

(Continued)

FOREIGN PATENT DOCUMENTS

| CN | 1827244 | 9/2006 |
| CN | 1848377 | 10/2006 |

(Continued)

OTHER PUBLICATIONS

"International Application Serial No. PCT US2020 038179, International Preliminary Report on Patentability mailed Dec. 30, 2021", 9 pages.

(Continued)

*Primary Examiner* — Mahdi H Nejad
*Assistant Examiner* — Dana Lee Poon
(74) *Attorney, Agent, or Firm* — Schwegman Lundberg & Woessner, P.A.

(57) ABSTRACT

In an example embodiment, a bidirectional indexing apparatus includes a plurality of bidirectional indexing heads that can operate independently of each other or in concert to adjust a gap between a substrate and a pedestal in a substrate processing chamber. In some embodiments, a bidirectional indexing head comprises a base; a rotatable plate rotatable relative to the base, the rotatable plate including a plurality of profiled pockets each defining a camming surface therein; and a plurality of camming pins, each disposed to act on the camming surface of a respective profiled pocket to move the rotatable plate in a first or second rotatable direction when actuated.

14 Claims, 8 Drawing Sheets

(51) Int. Cl.
*C23C 16/50* (2006.01)
*H01J 37/32* (2006.01)
*H01L 21/687* (2006.01)

(56) References Cited

U.S. PATENT DOCUMENTS

| | | | |
|---|---|---|---|
| 6,350,317 B1* | 2/2002 | Hao | H01J 37/32568 |
| | | | 118/727 |
| 10,600,673 B2* | 3/2020 | Schmotzer | H01L 21/68757 |
| 2004/0170407 A1* | 9/2004 | Nguyen | H01L 21/6734 |
| | | | 392/416 |
| 2008/0041820 A1 | 2/2008 | Tong et al. | |
| 2013/0302999 A1* | 11/2013 | Won | H01L 21/02211 |
| | | | 438/787 |
| 2014/0299166 A1 | 10/2014 | Furuya et al. | |
| 2015/0299166 A1* | 10/2015 | Tung | C07D 401/04 |
| | | | 435/375 |
| 2017/0040206 A1* | 2/2017 | Schmotzer | H01L 21/68785 |
| 2018/0087334 A1* | 3/2018 | Bouligny | F16H 1/225 |

FOREIGN PATENT DOCUMENTS

| | | |
|---|---|---|
| CN | 114008242 | 2/2022 |
| CN | 114008242 B | 12/2024 |
| JP | 2010027713 A | 2/2010 |
| KR | 101589667 B1 | 1/2016 |
| KR | 20170016798 | 2/2017 |

OTHER PUBLICATIONS

"Chinese Application Serial No. 202080044971.X, Office Action mailed Jan. 31, 2024", w English Translation, 13 pgs.

"Chinese Application Serial No. 202080044971.X, Response filed May 30, 2024 to Office Action mailed Jan. 31, 2024", w English claims, 3 pgs.

International Application Serial No. PCT/US2020/038179, International Search Report mailed Oct. 5, 2020, 3 pgs.

International Application Serial No. PCT/US2020/038179, Written Opinion mailed Oct. 5, 2020, 7 pgs.

"Korean Application Serial No. 10-2022-7001968, Notice of Preliminary Rejection mailed Aug. 29, 2024", w English translation, 17 pgs.

"Korean Application Serial No. 10-2022-7001968, Response filed Oct. 28, 2024 to Notice of Preliminary Rejection mailed Aug. 29, 2024", W English Claims, 23 pgs.

"Korean Application Serial No. 10-2022-7001968, Notice of Preliminary Rejection mailed Apr. 11, 2025", W Machine English Translation, 7 pgs.

"Korean Application Serial No. 10-2022-7001968, Response filed Jun. 11, 2025 to Notice of Preliminary Rejection mailed Apr. 11, 2025", W English Claims, 16 pgs.

* cited by examiner

SECTION A-A

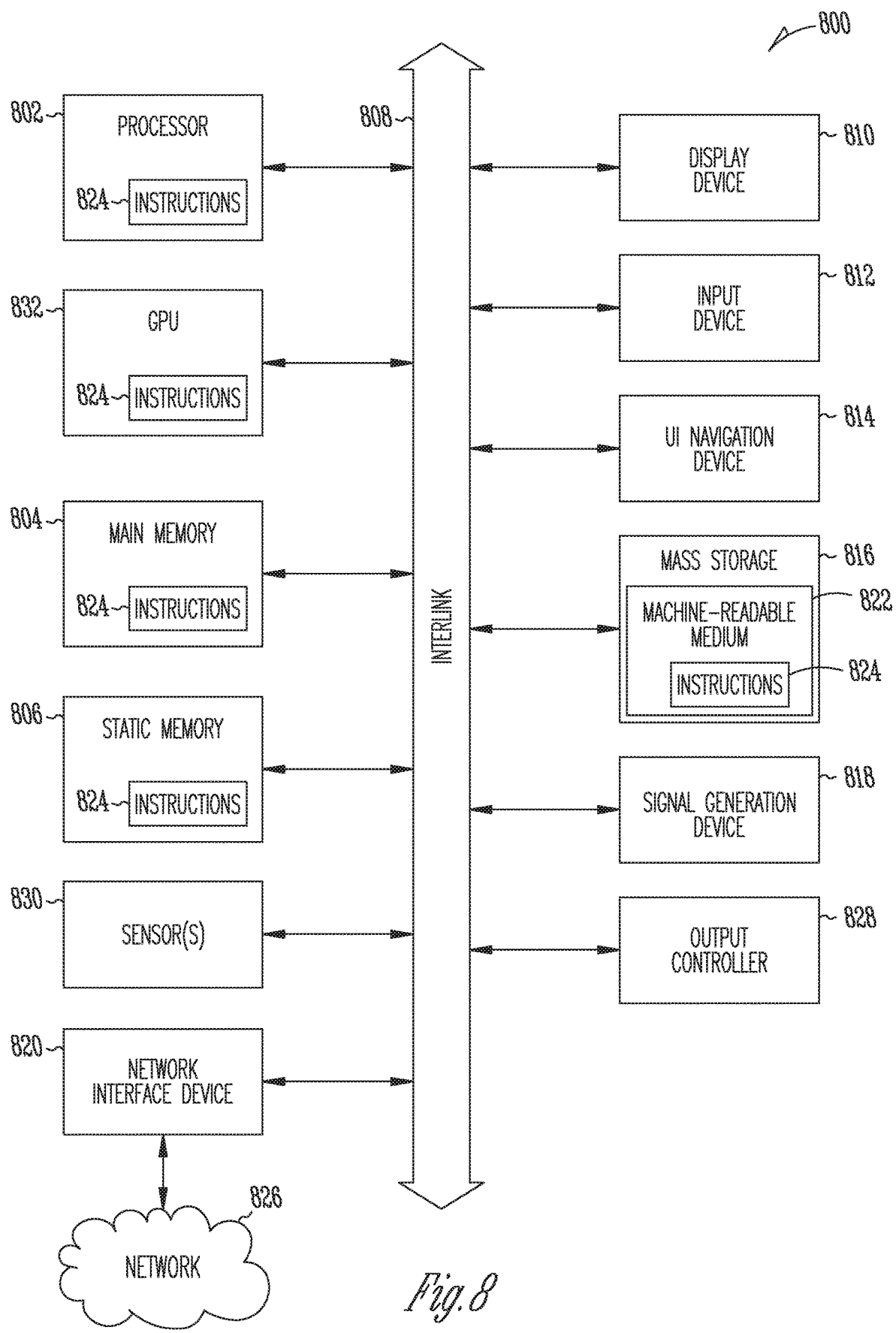

BIDIRECTIONAL INDEXING APPARATUS

CLAIM OF PRIORITY

This application is a U.S. National Stage Filing under 35 U.S.C. 371 from International Application No. PCT/US2020/038179, filed on Jun. 17, 2020, and published as WO 2020/257311 A1 on Dec. 24, 2020, which claims the benefit of priority to U.S. Patent Application No. 62/864,994, to Vintila et al, entitled "Bidirectional Indexing Apparatus" filed on Jun. 21, 2019, each of which is incorporated by reference herein in its entirety.

FIELD

The present disclosure relates generally to a bidirectional indexing apparatus for a substrate processing chamber. In one example embodiment, a bidirectional indexing apparatus includes a plurality of bidirectional indexing heads that can operate independently of each other or in concert to adjust a gap between a substrate and a pedestal in a substrate processing chamber.

BACKGROUND

During some substrate processing operations, a substrate is supported on a pedestal within a processing chamber. Typically, a height or gap between the substrate and the pedestal is not adjustable. In modern semiconductor processes, however, an inability to make a gap adjustment can be a significant drawback, particularly when seeking to optimize chamber conditions for creating nanosized structures in a plasma-enhanced chemical vapor deposition (PECVD) process, for example.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The present disclosure relates generally to a bidirectional indexing apparatus for a pedestal in a substrate processing chamber. In some examples, an indexing apparatus includes a plurality of bidirectional indexing heads that operate individually or in concert to adjust the height of a spaced gap between a pedestal and a substrate supported by the pedestal.

In some examples, a bidirectional indexing apparatus includes a rotatable plate having a rotational axis, and a number of profiled pockets formed in the plate. In some examples, the profiled pockets are arranged to be equally spaced around a circumference of the plate. In some examples, in an in-use orientation, the pockets are provided or formed in an underside of the plate. Each of the profiled pockets may include a profiled surface that acts as a camming surface, or cam. The cam may have a plane of symmetry at the middle of the pocket.

In some examples, an indexing apparatus may include three camming pins (or followers) that can be urged in an axial direction orthogonal to the plate to act against a cam to index the plate around the rotational axis (for example, in rotational increments in a bidirectional (forward or reverse) direction). In some examples, the three camming pins can act sequentially one after the other or in an ordered pattern to impart a series of continuous or discontinuous indexing motions to the plate in a forward or reverse direction. A sequence or pattern of camming pin actuation can produce one direction or another of plate rotation or combinations thereof.

In some examples, the rotational axis of the plate provides, or is aligned with, a lift direction of the indexing apparatus. The rotating plate of each indexing head in the indexing apparatus may act on a threaded screw or other device to impart movement to a substrate supported on a pedestal. The movement may include a lowering, raising, tilting or other movement of the substrate with reference to the pedestal, as is described more fully below. A sequence or pattern of camming pin actuation of the plurality of indexing heads may impart varying orientations of the plate (for example, a horizontal or an inclined orientation during substrate processing) or impart a vertical adjustment in the height of a spaced gap between the pedestal and a substrate supported by the pedestal. In some examples, the camming pins are actuated by a fluid pressure difference (for example, by one or more hydraulic linear pistons controlled by a controller).

In some examples, a bidirectional indexing head comprising: a base; a rotatable plate rotatable relative to the base, the rotatable plate including a plurality of profiled pockets each defining a camming surface therein; and a plurality of camming pins, each disposed to act on the camming surface of a respective profiled pocket to move the rotatable plate in a first or second rotatable direction when actuated.

In some examples, respective positions of the pluralities of profiled pockets and camming pins are correlated to allow continuous incremental indexing.

In some examples, each profiled pocket defines a camming surface having a plane of symmetry; and each of the plurality of camming pins is arranged to act on a respective camming surface of a profile pocket in a sequential manner.

In some examples, the plane of symmetry of each profiled pocket is configured to endow the rotatable plate with bidirectional rotational movement when a respective camming surface is acted upon by a respective camming pin.

In some examples, the bidirectional indexing head further comprises a threaded shaft connected to the rotatable plate.

In some examples, a bidirectional indexing apparatus comprises at least one indexing head as summarized above, or as described herein.

In some examples of a bidirectional indexing head and bidirectional indexing apparatus, a portion of the camming surface of a profiled pocket is linear in outline. In some examples of a bidirectional indexing head and bidirectional indexing apparatus, a portion of a camming surface of a camming pin is arcuate in outline.

BRIEF DESCRIPTION OF THE DRAWINGS

Some embodiments are illustrated by way of example and not limitation in the views of the accompanying drawing:

FIG. 8 is a block diagram illustrating an example of a machine upon which one or more example embodiments may be implemented, or by which one or more example embodiments may be controlled.

DESCRIPTION

Figure 1:
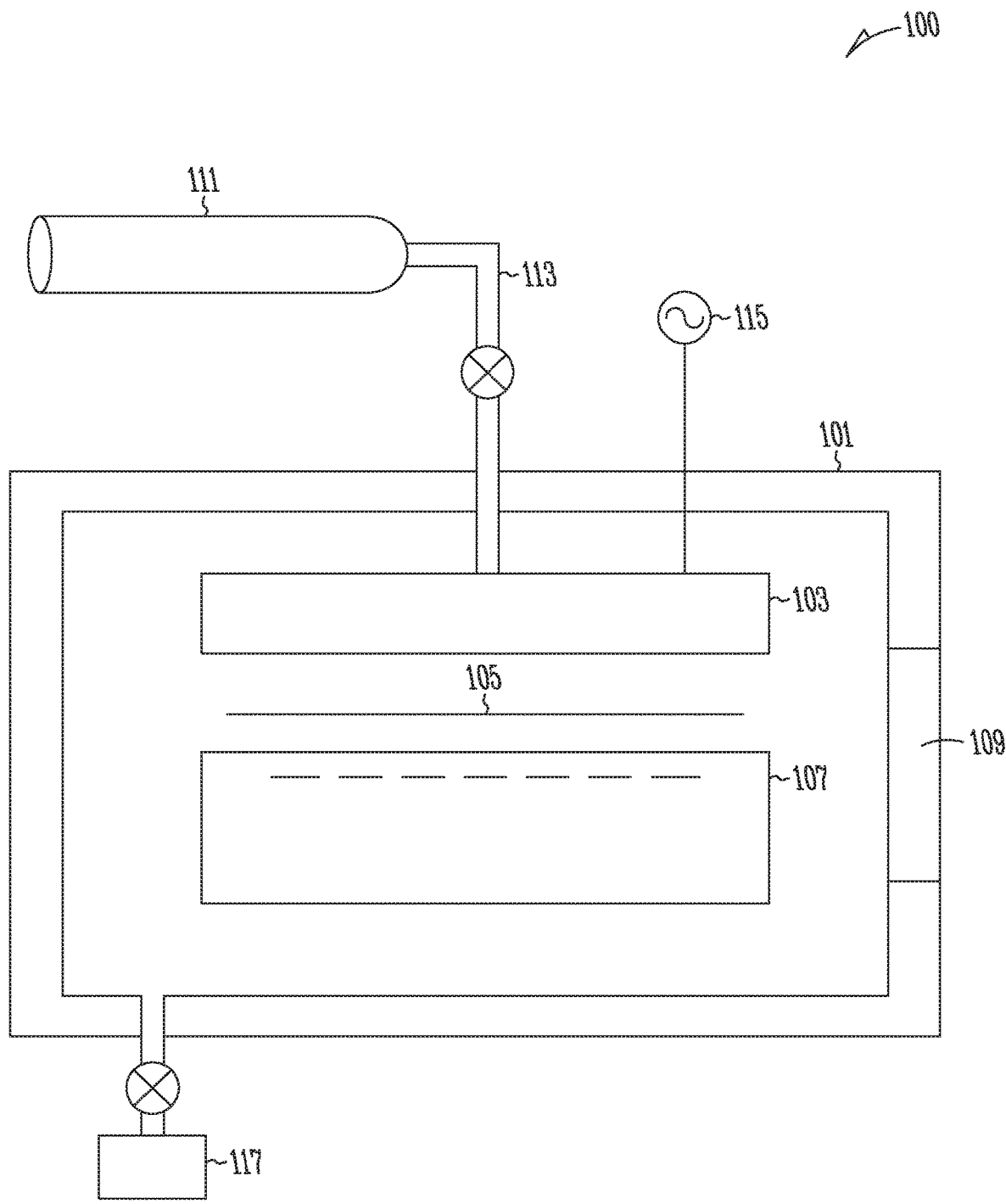
FIG. 1 is a schematic diagram of a processing chamber within which some examples of the methods of the present disclosure may be employed, according to some examples.

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present disclosure may be practiced without these specific details.

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2019-2020. All Rights Reserved.

With reference now to FIG. 1, an example arrangement 100 of a plasma-based processing chamber is shown. The present subject matter may be used in a variety of semiconductor manufacturing and substrate processing operations, but in the illustrated example, the plasma-based processing chamber is described in the context of plasma-enhanced or radical-enhanced Chemical Vapor Deposition (CVD) or Atomic Layer Deposition (ALD) operations. The skilled artisan will also recognize that other types of ALD processing techniques are known (e.g., thermal-based ALD operations) and may incorporate a non-plasma-based processing chamber. An ALD tool is a specialized type of CVD processing system in which ALD reactions occur between two or more chemical species. The two or more chemical species are referred to as precursor gases and are used to form a thin film deposition of a material on a substrate, such as a silicon substrate as used in the semiconductor industry. The precursor gases are sequentially introduced into an ALD processing chamber and react with a surface of the substrate to form a deposition layer. Generally, the substrate repeatedly interacts with the precursors to deposit slowly an increasingly thick layer of one or more material films on the substrate. In certain applications, multiple precursor gases may be used to form various types of film or films during a substrate manufacturing process.

FIG. 1 is shown to include a plasma-based processing chamber 101 in which a showerhead 103 (which may be a showerhead electrode) and a substrate-support assembly or pedestal 107 are disposed. The substrate-support assembly or pedestal 107 may include an indexing head such as is described in more detail below. Typically, the substrate-support assembly 107 seeks to provide a substantially-isothermal surface and may serve as both a heating element and a heat sink for a substrate 105. The substrate-support assembly 107 may comprise an Electrostatic Chuck (ESC) in which heating elements are included to aid in processing the substrate 105, as described above. The substrate 105 may include a substrate comprising elemental semiconductors (e.g., silicon or germanium), a substrate comprising compound elements (e.g., gallium arsenide (GaAs) or gallium nitride (GaN)), or a variety of other substrate types (including conductive, semi-conductive, and non-conductive substrates).

In operation, the substrate 105 is loaded through a loading port 109 onto the substrate-support assembly 107. A gas line 113 can supply one or more process gases (e.g., precursor gases) to the showerhead 103. In turn, the showerhead 103 delivers the one or more process gases into the plasma-based processing chamber 101. A gas source 111 (e.g., one or more precursor gas ampules) to supply the one or more process gases is coupled to the gas line 113. In some examples, an RF (radio frequency) power source 115 is coupled to the showerhead 103. In other examples, a power source is coupled to the substrate-support assembly 107 or ESC.

Prior to entry into the showerhead 103 and downstream of the gas line 113, a point-of-use (POU) and manifold combination (not shown) controls entry of the one or more process gases into the plasma-based processing chamber 101. In the case of a plasma-based processing chamber 101 used to deposit thin films in a plasma-enhanced ALD operation, precursor gases may be mixed in the showerhead 103.

In operation, the plasma-based processing chamber 101 is evacuated by a vacuum pump 117. RF power is capacitively coupled between the showerhead 103 and a lower electrode (not shown explicitly) contained within or on the substrate-support assembly 107. The substrate-support assembly 107 is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. A coil designed to block or partially block a particular RF frequency can be designed as needed. Therefore, particular frequencies discussed herein are provided merely for ease in understanding. The RF power is used to energize the one or more process gases into a plasma in the space between the substrate 105 and the showerhead 103. The plasma can assist in depositing various layers (not shown) on the substrate 105. In other applications, the plasma can be used to etch device features into the various layers on the substrate 105. RF power is coupled through at least the substrate-support assembly 107. The substrate-support assembly 107 may have heaters (not shown in FIG. 1) incorporated therein. The detailed design of the plasma-based processing chamber 101 may vary.

Figure 2:
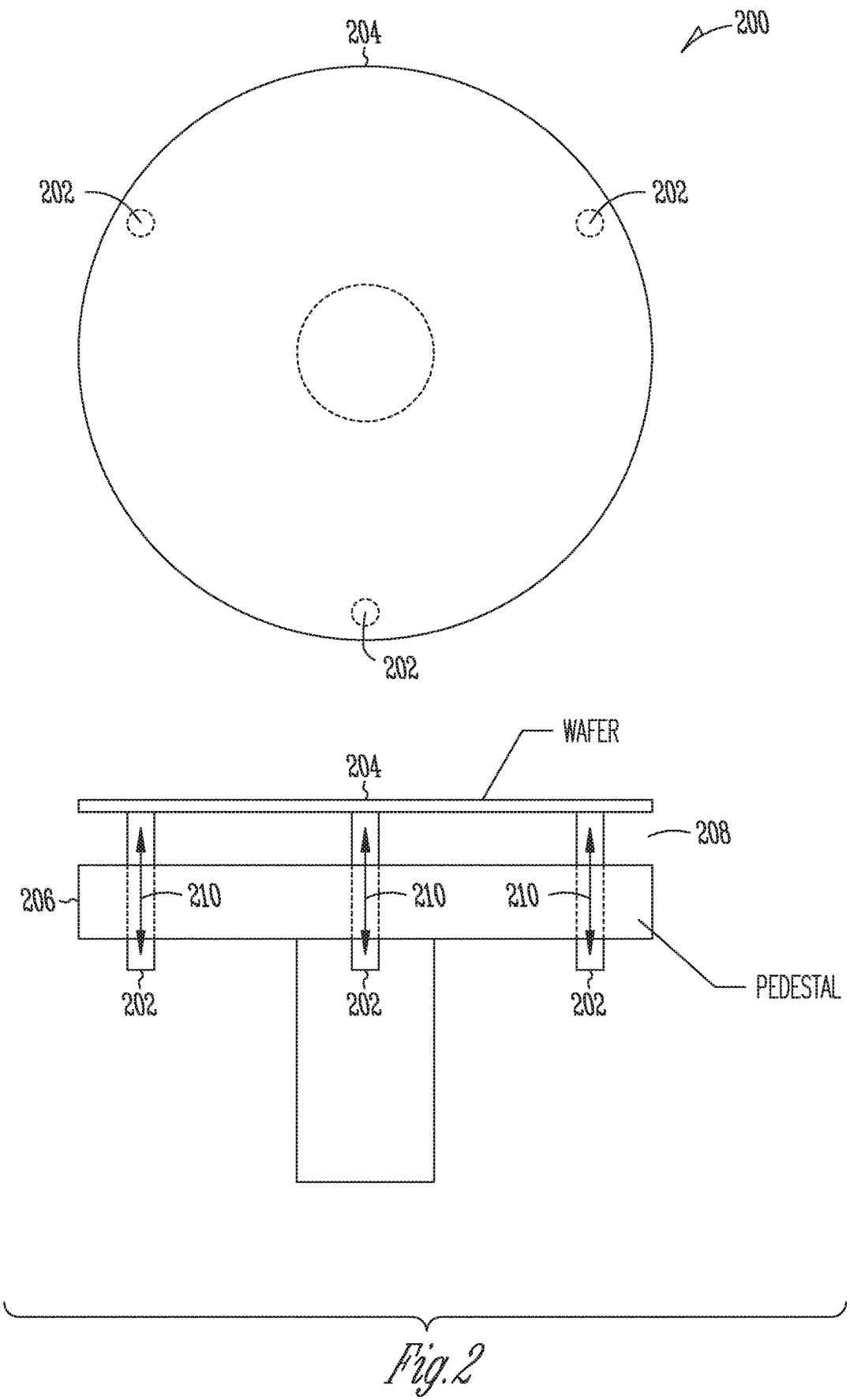
FIG. 2 is a schematic view of an indexing apparatus, according to an example embodiment.

FIG. 2 is a schematic view of an example indexing apparatus 200. The indexing apparatus 200 includes a plurality of indexing heads (or mechanisms) shown generally at 202. The illustrated example embodiment includes three indexing heads 202 provided in a circular arrangement, as shown. The location of each indexing head 202 is proximate an edge of a substrate, such as a substrate 204. The indexing heads 202 are provided in association with a pedestal 206, for example the pedestal 107 of FIG. 1, that supports the substrate 204 in a processing chamber, for example the processing chamber 101 of FIG. 1. The indexing heads 202 can operate independently of each other or together (in concert) under guidance of a controller (not shown) to adjust the vertical height of a gap 208 between the substrate 204 and the pedestal 206. The vertical adjustment is made in a lift direction 210 indicated by the numbered arrows. As described more fully below, each indexing head may include a threaded pin driven by a bidirectional index mechanism. In some examples, the threaded pin includes a differential screw if more precision in gap adjustment is required.

Figure 3:
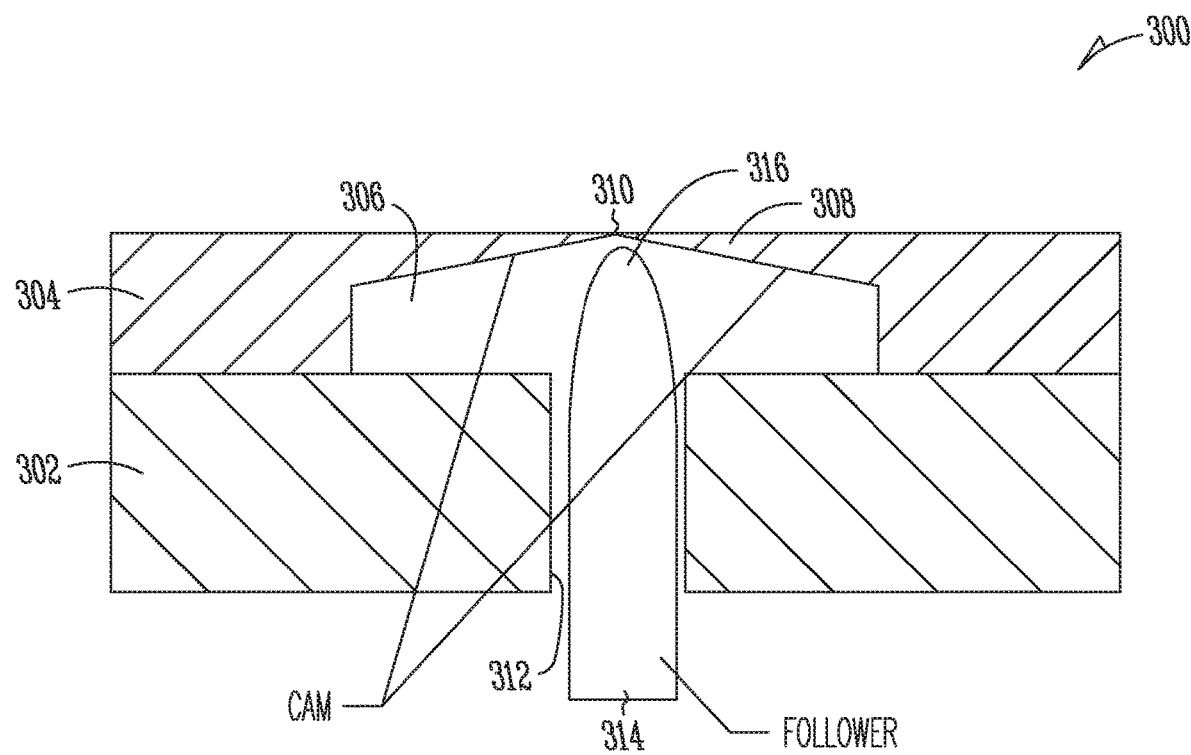
FIG. 3 is a schematic sectional view, taken at the line A-A of FIG. 4, of a portion of an indexing head, taken according to an example embodiment.
Figure 4:
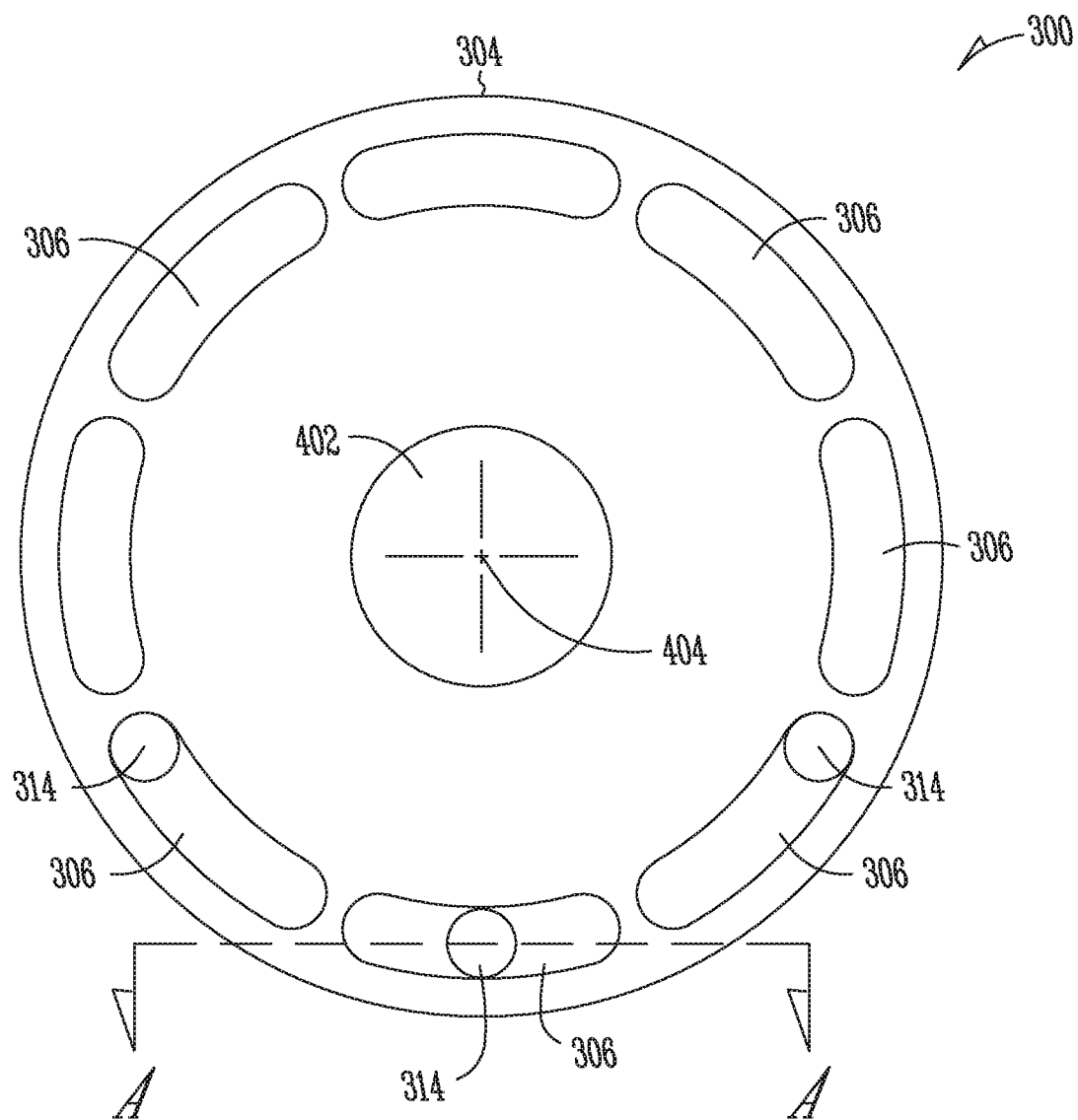
FIG. 4 is an underside, schematic sectional view of an indexing head, according to an example embodiment.

An example indexing head 300 is illustrated in a schematic sectional outline in FIG. 3. The indexing head 300 includes a base 302 and a rotatable plate 304. The rotatable plate 304 is fixed in a vertical direction relative the base 302 but is rotatable relative thereto. An opposite rotational arrangement is possible. A profiled pocket (or cam) 306 is formed in an underside of the plate 304, as shown. The profiled pocket 306 includes a profiled surface 308 that acts as a camming surface 308. The camming surface 308 may have a plane of symmetry at a middle 310 of the profiled pocket 306. In the illustrated example, the middle 310 of the profiled pocket 306 is located at an apex of the pocket 306. Other locations within the pocket are possible. The camming surface 308 is planar or linear in the view. Other profiles are possible. With reference to FIG. 4, a series of equally-spaced profiled pockets 306, in this case eight pockets 306, is provided in the rotatable plate 304 of the indexing head 300.

Returning to FIG. 3, the base 302 of the indexing head 300 includes an aperture 312. A camming pin 314 is movable in an axial direction, aligned with the lift direction 210 in FIG. 2, through the aperture 312. The camming pin 314 has a shaped head 316 that acts in use against the camming surface 308 of the profiled pocket 306. It will be appreciated that axial movement (up or down in the view) of the camming pin 314 will cause or allow bidirectional (left or right) rotational movement of the rotatable plate 304. In the illustrated view, the camming pin is shown in a "locked" upward position with the head 316 of the camming pin 314 secured in the apex of the pocket 306. Bidirectional rotational movement of the rotatable plate 304 is not possible when the pin 314 is locked in this upward position. In other unlocked positions, upward axial movement of the camming pin 314, acting against the camming surface 308, imparts bidirectional rotational movement of the rotatable plate 304 left or right around a rotational axis 404 depending on which side of the plane of symmetry the camming pin 314 acts. With reference again to FIG. 4, three camming pins 314 are provided in the illustrated example. Other numbers and arrangements of camming pins 314 are possible.

With further reference to FIG. 4, in some examples, the rotatable plate 304 is fixed to or associated with a threaded lift pin or shaft 402 of the indexing head 300. Under action of the camming pins 314, the threaded shaft 402 is driven to rotate by the rotatable plate 304 in a forward or reverse (bidirectional) direction. With reference back to FIG. 2, as noted therein, such turning motion of the threaded shaft causes the indexing head 300 to lift or lower the substrate 204 at each location of an indexing head (202 or 300) to adjust the gap 208 between the substrate 204 and the pedestal 206.

Figure 5:
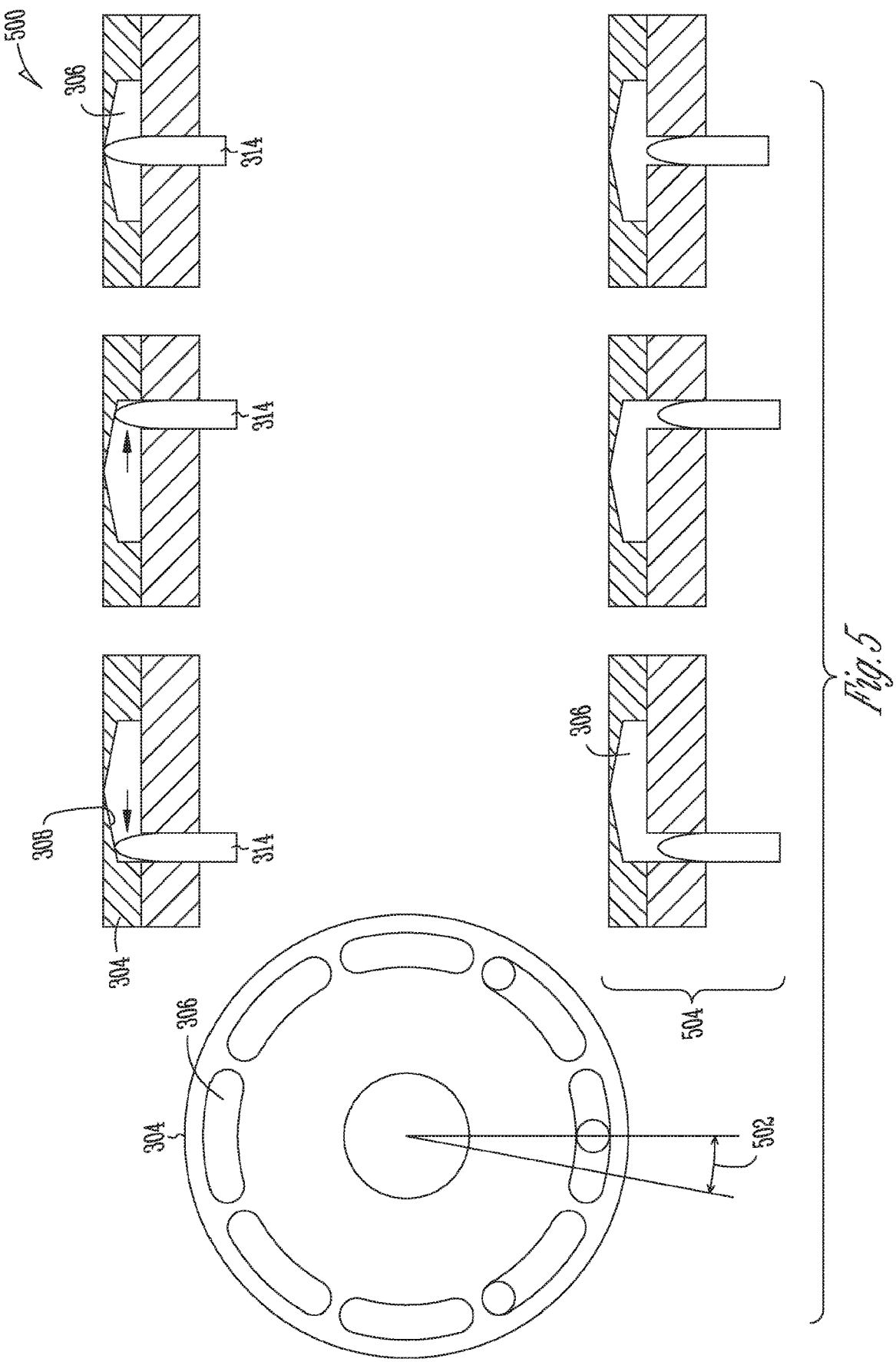
FIG. 5 shows aspects of actuation states for an indexing head, according to example embodiments.

With reference to FIG. 5, an indexing head 202 or 300 may have an actuation pitch 502. This represents a degree of rotational movement imparted to a rotatable plate 304 for a single stroke of a camming pin 314. The upper series 500 of three views indicate three relative positions of a camming pin 314 in ready-to-actuate states. In some examples, only one camming pin 314 is actuated at a time. The arrows in the series of views indicate the direction of rotation when the camming pin is urged upwardly. Thus, in the left view, axial upward movement of the camming pin 314 acting against the camming surface 308 of the pocket 306 cams the rotatable plate 304 to the left. The middle view shows a camming pin configuration imparting the opposite rotational direction, the symmetrical cam (plane of symmetry) thus providing bidirectional movement to an indexing head. The right view in the series 500 depicts a locked configuration of the camming pin 314 and the rotatable plate 304. A lower series 504 of three views depicts configurations of the camming pin between actuation states. In some examples, two camming pins 314 are in this state at a time, i.e., at an end of a pocket 306 as shown for example in FIGS. 6-7.

Thus, in some examples, an indexing apparatus 200 includes a plurality of bidirectional indexing heads 202 (or 300) that operate individually or in concert to adjust the height of a spaced gap 208 between a pedestal 206 and a substrate 204 supported by the pedestal 206. In some examples, the bidirectional indexing apparatus 200 includes a rotatable plate 304 having a rotational axis (404, FIG. 4) and one or more profiled pockets 306 formed in the rotatable plate 304. In some examples, the profiled pockets 306 are arranged to be equally spaced around a circumference of the plate 304, as shown for example. In some examples, the pockets 306 are provided or formed in an underside of the plate 304. Each of the profiled pockets 306 may include a profiled surface that acts as a camming surface 308, or cam. The camming surface 308 may have a plane of symmetry at the middle of the pocket 306.

In some examples, an indexing apparatus 200 may include one or more camming pins (or followers) 314 that can be urged in an axial direction orthogonally to the rotatable plate 304 to act against the camming surface 308 of a profiled pocket 306 to index the rotatable plate 304 around the rotational axis 404 (for example, in rotational increments in a bidirectional (forward or reverse) direction). In some examples, the rotational axis of the plate provides, or is aligned with, a lift direction of the indexing apparatus. The rotating plate of each indexing head in the indexing apparatus may act on a threaded screw or other device to impart a lowering or raising of a pedestal, as is described more fully below.

Thus, in some examples, a plurality of camming pins 314 can act sequentially one after the other or in an ordered pattern to impart a series of continuous or discontinuous indexing motions to the rotatable plate 304 in a forward or reverse direction (up or down, left or right, at each of the locations of the indexing heads 202 or 300). A sequence or pattern of camming pin actuation can produce one direction or another of plate 304 rotation or combinations of movement.

A sequence or pattern of camming pin 314 actuations within the plurality of indexing heads 202 or 300, at each of the three indexing head locations, allows the implementation of varying planar orientations of a substrate 204 (for example, a horizontal orientation or an inclined orientation of the substrate 204 with respect to a plasma gas during substrate processing). Other embodiments of an indexing apparatus 200 may not adjust a planar orientation of a substrate 204 but merely adjust the height of the spaced gap 208 between the pedestal 206 and a substrate 204 supported by the pedestal 206. In other examples, various combinations of substrate 204 plane orientation and gap 208 height adjustment are possible.

Figure 6:
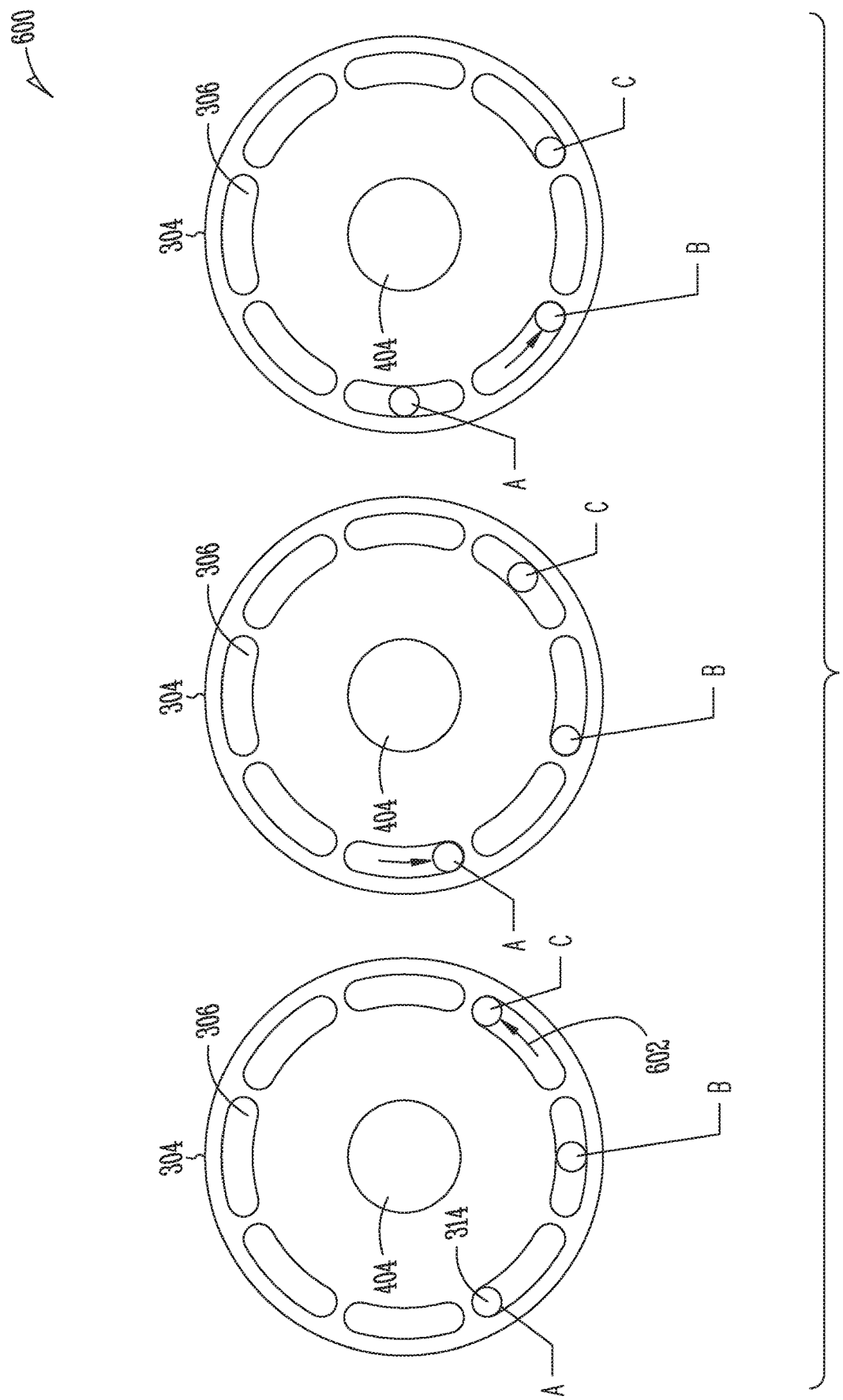
FIGS. 6-7 show aspects of bidirectional movement of an indexing head, according to example embodiments.

In this regard, reference is now made to FIGS. 5-6. In FIG. 6, an anticlockwise actuation sequence 600 of camming pins 314 is shown for rotating the rotatable plate 304 in an anticlockwise direction in the view. The rotatable plate 304 is attached to a threaded shaft 402 of an indexing apparatus 200. The threaded shaft 402 is driven by the rotatable plate 304 and engages with other components of the indexing head 202 or 300 to adjust a spaced gap or substrate plane orientation, for example as described above.

Figure 7:
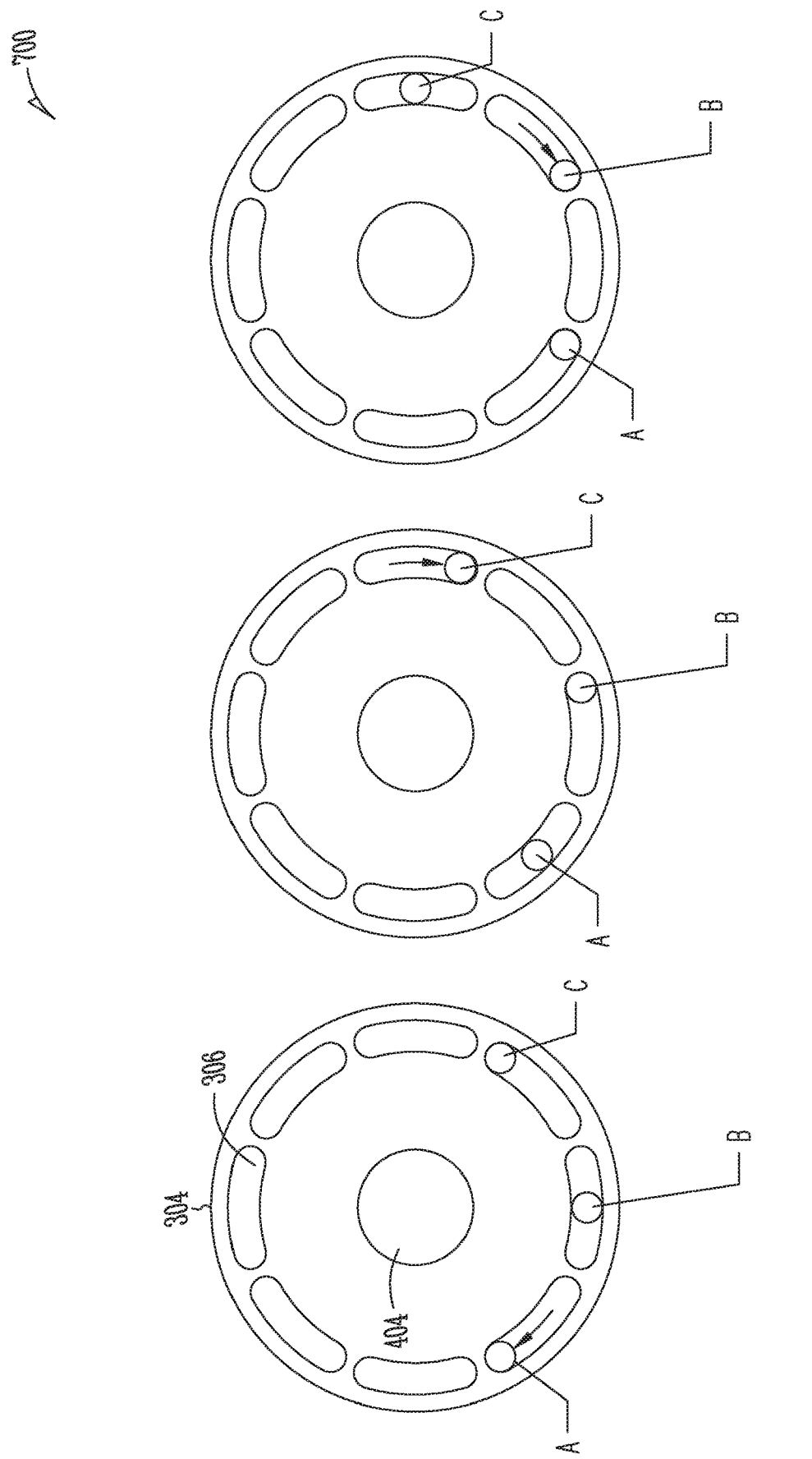

The illustrated camming pins 314 can each move upwardly (into the page) to act upon the inclined camming surface 308 of a respective profiled pocket 306. Thus, when the camming pin 314 marked C is urged upwards (into the page), the rotatable plate 304 is caused to move in the direction of the associated arrow 602. Subsequent or sequential rotational movements can be imparted to the rotatable table 304 by actuation of the camming pins marked A and B in an ordered actuation sequence or pattern C-A-B. In the left view, the camming pin B is unlocked and withdrawn from the locking position discussed above. Rotational movement of the rotatable plate 304 is permitted. It will be seen that over the course of the C-A-B actuation sequence, the camming pin C has relocated from the right of the associated pocket 306 to the left of the same pocket 306. The camming pin A has moved to a new pocket 306 relative to the rotatable plate 304. FIG. 7 shows a similar arrangement but this time for a clockwise actuation sequence 700. In the illustrated example, the actuation sequence 700 of the camming pins 314 is A-C-B.

Although an example indexing head has been described herein in the context of eight profiled pockets and three camming pins, it will be appreciated that other numbers and arrangements are possible. Three camming pins is considered convenient because one pin can be poised to move the rotatable plate to the left, another pin ready to move the rotatable plate to the right, and the third pin ready to adopt a locking position, if needed. Two camming pins may work if a simpler reciprocating movement or arrangement is desired. Further camming pins may spread loads across a greater number of pins, or provide greater engagement with a series of pockets, for example. Inter-pocket spacing may be configured to provide a finer indexing increment for each stroke of a camming pin, for example. In some examples, the position of the pockets and camming pins are correlated to allow continuous (smooth) or discontinuous (incremental) indexing. In the example indexing head described above, a camming pin may "move" from pocket to pocket as the rotating plate is indexed around. In other arrangements, such relocation may not be provided.

In some examples, for precision of movement and ease of control, the camming pins 314 are actuated by one or more hydraulic linear pistons controlled by a controller. The controller may control the bidirectional indexing heads to impart combinations of substrate plane orientation and gap adjustment based on feedback from sensors in the processing chamber 101, based on manual input from an operator, based on algorithmic instructions, or a combination of the above.

FIG. 8 is a block diagram illustrating an example of a machine or controller 800 by which one or more example embodiments described herein may be controlled. In alternative embodiments, the controller 800 may operate as a standalone device or may be connected (e.g., networked) to other machines. In a networked deployment, the controller 800 may operate in the capacity of a server machine, a client machine, or both in server-client network environments. In an example, the controller 800 may act as a peer machine in a peer-to-peer (P2P) (or other distributed) network environment. Further, while only a single controller 800 is illustrated, the term "machine" (controller) shall also be taken to include any collection of machines (controllers) that individually or jointly execute a set (or multiple sets) of instructions to perform any one or more of the methodologies discussed herein, such as via cloud computing, software as a service (SaaS), or other computer cluster configurations. In some examples, and referring to FIG. 8, a non-transitory machine-readable medium includes instructions 824 that, when read by a controller 800, cause the controller to control operations in methods comprising at least the non-limiting example operations described herein.

Examples, as described herein, may include, or may operate by logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 800 may include a hardware processor 802 (e.g., a central processing unit (CPU), a hardware processor core, or any combination thereof), a graphics processing unit (GPU) 832, a main memory 804, and a static memory 806, some or all of which may communicate with each other via an interlink (e.g., bus) 808. The controller 800 may further include a display device 810, an alphanumeric input device 812 (e.g., a keyboard), and a user interface (UI) navigation device 814 (e.g., a mouse). In an example, the display device 810, alphanumeric input device 812, and UI navigation device 814 may be a touch screen display. The controller 800 may additionally include a mass storage device (e.g., drive unit) 816, a signal generation device 818 (e.g., a speaker), a network interface device 820, and one or more sensors 830, such as a Global Positioning System (GPS) sensor, compass, accelerometer, or another sensor. The controller 800 may include an output controller 828, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 816 may include a machine-readable medium 822 on which is stored one or more sets of data structures or instructions 824 (e.g., software) embodying or utilized by any one or more of the techniques or functions described herein. The instructions 824 may as shown also reside, completely or at least partially, within the main memory 804, within the static memory 806, within the hardware processor 802, or within the GPU 832 during execution thereof by the controller 800. In an example, one or any combination of the hardware processor 802, the GPU 832, the main memory 804, the static memory 806, or the mass storage device 816 may constitute machine-readable media 822.

While the machine-readable medium 822 is illustrated as a single medium, the term "machine-readable medium" may include a single medium, or multiple media (e.g., a centralized or distributed database, and/or associated caches and servers) configured to store the one or more instructions 824.

The term "machine-readable medium" may include any medium that can store, encode, or carry instructions 824 for execution by the controller 800 and that cause the controller 800 to perform any one or more of the techniques of the present disclosure, or that can store, encode, or carry data structures used by or associated with such instructions 824. Non-limiting machine-readable medium examples may include solid-state memories, and optical and magnetic media. In an example, a massed machine-readable medium comprises a machine-readable medium 822 with a plurality of particles having invariant (e.g., rest) mass. Accordingly, massed machine-readable media are not transitory propagating signals. Specific examples of massed machine-readable media may include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks. The instructions 824 may further be transmitted or received over a communications network 826 using a transmission medium via the network interface device 820.

Although examples have been described with reference to specific example embodiments or methods, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This detailed description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. A bidirectional indexing head comprising;
   a base;
   a rotatable plate rotatable relative to the base, the rotatable plate including a plurality of profiled pockets each defining a camming surface therein, wherein each profiled pocket defines a camming surface having a plane of symmetry; and
   a plurality of camming pins, each disposed to act on the camming surface of a respective profiled pocket to move the rotatable plate in wherein each camming pin is movable in an axial direction, aligned with a lifting direction.

2. The bidirectional indexing head of claim 1, wherein respective positions of the plurality of profiled pockets and camming pins are correlated to allow continuous incremental indexing.

3. The bidirectional indexing head of claim 2, wherein each of the plurality of camming pins is arranged to act on a respective camming surface of a profile pocket in a sequential manner.

4. The bidirectional indexing head of claim 1, wherein the plane of symmetry of each profiled pocket is configured to endow the rotatable plate with bidirectional rotational movement when a respective camming surface is acted upon by a respective camming pin.

5. The bidirectional indexing head of claim 1, further comprising a threaded shaft connected to the rotatable plate.

6. The bidirectional indexing head of claim 1, wherein a portion of the camming surface of a profiled pocket is linear in outline.

7. The bidirectional indexing head of claim 1, wherein a portion of a camming surface of a camming pin is arcuate in outline.

8. A bidirectional indexing apparatus including at least one indexing head, the at least one indexing head comprising;
   a base;
   a rotatable plate rotatable relative to the base, the rotatable plate including a plurality of profiled pockets each defining a camming surface therein, wherein each profiled pocket defines a camming surface having a plane of symmetry; and
   a plurality of camming pins, each disposed to act on the camming surface of a respective profiled pocket to move the rotatable plate in wherein each camming pin is movable in an axial direction, aligned with a lifting direction.

9. The bidirectional indexing apparatus of claim 8, wherein respective positions of the plurality of profiled pockets and camming pins are correlated to allow continuous incremental indexing.

10. The bidirectional indexing apparatus of claim 9, wherein each of the plurality of camming pins is arranged to act on a respective camming surface of a profile pocket in a sequential manner.

11. The bidirectional indexing apparatus of claim 8, wherein the plane of symmetry of each profiled pocket is configured to endow the rotatable plate with bidirectional rotational movement when a respective camming surface is acted upon by a respective camming pin.

12. The bidirectional indexing apparatus of claim 8, wherein the at least one indexing head further comprises a threaded shaft connected to the rotatable plate.

13. The bidirectional indexing apparatus of claim 8, wherein a portion of the camming surface of a profiled pocket is linear in outline.

14. The bidirectional indexing apparatus of claim 8, wherein a portion of a camming surface of a camming pin is arcuate in outline.

* * * * *